(12) United States Patent
Pain

(10) Patent No.: US 7,425,460 B2
(45) Date of Patent: Sep. 16, 2008

(54) METHOD FOR IMPLEMENTATION OF BACK-ILLUMINATED CMOS OR CCD IMAGERS

(75) Inventor: Bedabrata Pain, Los Angeles, CA (US)

(73) Assignee: California Institute of Technology, Pasadena, CA (US)

( * ) Notice: Subject to any disclaimer, the term of this patent is extended or adjusted under 35 U.S.C. 154(b) by 317 days.

(21) Appl. No.: 11/226,902

(22) Filed: Sep. 13, 2005

(65) Prior Publication Data

US 2006/0068586 A1   Mar. 30, 2006

Related U.S. Application Data

(60) Provisional application No. 60/610,831, filed on Sep. 17, 2004, provisional application No. 60/610,830, filed on Sep. 17, 2004.

(51) Int. Cl.
  *H01L 21/00* (2006.01)
(52) U.S. Cl. .................... 438/29; 438/57; 438/149; 257/E33.068
(58) Field of Classification Search .......... 438/34, 438/29, 32, 57–60, 149; 257/E33.068
  See application file for complete search history.

(56) References Cited

U.S. PATENT DOCUMENTS

| | | | |
|---|---|---|---|
| 4,422,091 A | 12/1983 | Liu | 257/183.1 |
| 4,656,519 A | 4/1987 | Savoye | 348/322 |
| 4,774,557 A | 9/1988 | Kosonocky | 257/222 |
| 5,122,669 A | 6/1992 | Herring et al. | 250/370.14 |
| 5,134,274 A | 7/1992 | Poole et al. | 250/208.1 |
| 5,227,313 A | 7/1993 | Gluck et al. | 438/66 |
| 5,244,817 A | 9/1993 | Hawkins et al. | 438/64 |
| 5,424,574 A | 6/1995 | Morgante | 399/281 |
| 5,688,715 A | 11/1997 | Sexton et al. | 438/75 |
| 5,907,767 A | 5/1999 | Tohyama | 438/75 |
| 5,940,685 A | 8/1999 | Loomis | 438/60 |
| 6,040,591 A | 3/2000 | Otsuka | 257/232 |
| 6,168,965 B1 | 1/2001 | Malinovich et al. | 438/66 |
| 6,169,319 B1 | 1/2001 | Malinovich et al. | 257/447 |
| 6,204,506 B1 | 3/2001 | Akahori et al. | 438/57 |
| 6,242,730 B1 | 6/2001 | Lin et al. | 250/208.1 |
| 6,259,085 B1 | 7/2001 | Holland | 250/208.1 |
| 6,429,036 B1 | 8/2002 | Nixon et al. | 438/57 |
| 6,498,073 B2 | 12/2002 | Sarma et al. | 438/459 |
| 6,498,336 B1 | 12/2002 | Tian et al. | 250/214.1 |
| 6,809,008 B1 | 10/2004 | Holm et al. | 438/455 |
| 6,927,432 B2 | 8/2005 | Holm et al. | 257/290 |
| 6,989,569 B1 * | 1/2006 | Hiramoto et al. | 257/347 |
| 2001/0019164 A1 | 9/2001 | Yin | |
| 2001/0026001 A1 | 10/2001 | Yagi | |

(Continued)

FOREIGN PATENT DOCUMENTS

DE   198 38 373 A1   3/2000

(Continued)

*Primary Examiner*—H. Jey Tsai
(74) *Attorney, Agent, or Firm*—Steinfl & Bruno

(57) ABSTRACT

A method for implementation of back-illuminated CMOS or CCD imagers. An oxide layer buried between silicon wafer and device silicon is provided. The oxide layer forms a passivation layer in the imaging structure. A device layer and interlayer dielectric are formed, and the silicon wafer is removed to expose the oxide layer.

12 Claims, 9 Drawing Sheets

U.S. PATENT DOCUMENTS

| | | |
|---|---|---|
| 2002/0084474 A1 | 7/2002 | Sarma et al. |
| 2003/0025160 A1 | 2/2003 | Suzuki et al. |
| 2003/0038289 A1 | 2/2003 | Yamakazi |
| 2003/0214595 A1 | 11/2003 | Mabuchi |
| 2003/0222204 A1 | 12/2003 | Gidon |
| 2004/0233503 A1* | 11/2004 | Kimura ..................... 359/275 |
| 2005/0074954 A1 | 4/2005 | Yamanaka |
| 2005/0104148 A1 | 5/2005 | Yamamoto et al. |
| 2006/0057764 A1* | 3/2006 | Pan et al. ..................... 438/70 |
| 2006/0244067 A1* | 11/2006 | Socher et al. ............... 257/350 |

FOREIGN PATENT DOCUMENTS

| | | |
|---|---|---|
| JP | 2004/134672 A | 4/2004 |
| WO | 2004/054001 | 6/2004 |

* cited by examiner

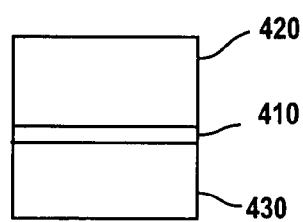
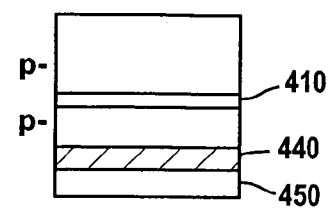
FIG. 9A    FIG. 9B
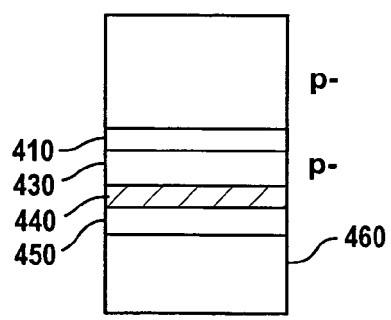
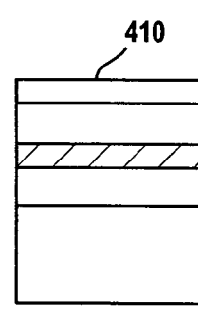
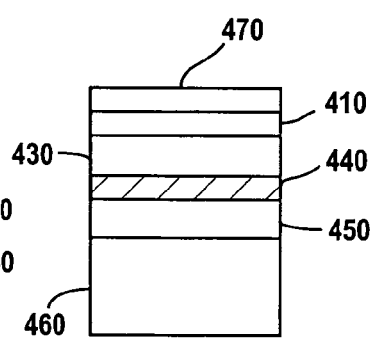
FIG. 9C    FIG. 9D    FIG. 9E

METHOD FOR IMPLEMENTATION OF BACK-ILLUMINATED CMOS OR CCD IMAGERS

CROSS REFERENCE TO RELATED APPLICATIONS

This application claims the benefit of U.S. provisional Patent Application Ser. No. 60/610,830, filed Sep. 17, 2004 for a "Back-Illuminated Visible Imager" by Bedabrata Pain and Thomas J Cunningham and U.S. Provisional Patent Application Ser. No. 60/610,831, filed Sep. 17, 2004 for "Architecture and Methods for High-Efficiency Visible Imager Implementation" by Bedabrata Pain, the disclosure of all of which is incorporated herein by reference in its entirety. This application is also related to U.S. application Ser. No. 11/226,903, for a "Structure for Implementation of Back-Illuminated CMOS or CCD Imagers" filed on the same date of the present application, also incorporated herein by reference in its entirety.

STATEMENT OF FEDERAL INTEREST

The invention described herein was made in the performance of work under a NASA contract, and is subject to the provisions of Public Law 96-517 (35 USC 202) in which the Contractor has elected to retain title.

FIELD

The present disclosure relates to imagers and, in particular, to a method for implementing a backside illuminated imager.

BACKGROUND

Current commercial CMOS imagers are front-illuminated. FIG. 1 shows a vertical cross-section of the optical collection part of a front-illuminated pixel.

The photodetector 10 comprises an ion-implanted cathode 20 on an epitaxial or substrate silicon layer 30 that acts as the anode. The photodetector 10 is mechanically supported by a thick (about 0.5 to 0.7 mm) silicon substrate 40, in keeping with conventional VLSI micro-fabrication paradigm.

FIG. 1 also shows metal layers 50 for interconnection of circuits and photo-detectors fabricated on the epitaxial silicon layer 30. The metal layers 50 are separated and protected by inter-layer dielectric (ILD) 60.

The main problem of imaging with a structure as shown schematically in FIG. 1 is the increased distance between the point 70 where light enters the system and the silicon 30 where light is detected, i.e. converted to photoelectrons. As shown in FIG. 1, light has to travel trough many layers of dielectric and interconnect metal layers (metal bus lines) suffering multiple reflections, obscurations, and deflections, before it is actually collected by silicon. For a small sized pixel, the aspect ration between the vertical distance to the photodiode width can be as high as 3:1. This is akin to shining flash light in a canyon. Due to the increased distance between the color-filter/micro-lens and the silicon surface, the device suffers from poor collection efficiency, low sensitivity, low quantum efficiency (QE), increased cross-talk, and poor angular response.

QE loss occurs due to a loss of optical fill factor (defined as the ratio of the optical collection area to the pixel area), especially as the pixel size is scaled. Poor angular response results from the increase in the aspect ratio, especially as the pixel size is scaled down as well as from increased unwanted reflections and occultations at metal edges. Increased cross-talk is due to a large separation (determined by the ILD thickness) between the silicon and color-filter layers, and due to lateral movement of focus point as the angle of acceptance is changed.

In other words, the front-side illumination structure of FIG. 1 suffers from poor QE and angular response uniformity, increased optical cross-talk, and stray-light coupling, especially as the pixel size is scaled. The addition of an anti-reflection coating is nearly impossible because of the presence of multi-layers with unfavorable dielectric constants and due to non-planarity of the photo-collection junction.

Technology scaling actually makes the problem worse, since the number of metals, and the thickness of ILDs increases with scaling, resulting in an even higher skewing of the aspect ratio. Furthermore, the introduction of low-k dielectric, and use of alternate metals (e.g. Cu) for interconnection is expected to further exacerbate the problems through increased absorption and scattering in the metal-dielectric stack.

SUMMARY

According to a first aspect, a wafer-level process of fabricating an imaging structure is disclosed, comprising: providing a wafer comprising an oxide layer buried between silicon wafer and device silicon, the oxide layer adapted to form a passivation layer in the imaging structure; forming a device layer and interlayer dielectric; and removing the silicon wafer to expose the oxide layer.

According to a second aspect, a wafer-scale process for fabricating a backside illuminated imager is disclosed, comprising: providing a wafer comprising a thermal oxide layer buried between a silicon wafer and device silicon; forming a device layer; providing interlayer dielectric to be connected to the device layer; bonding the interlayer dielectric to a glass wafer; removing the silicon wafer; and depositing anti-reflection coating.

According to a third aspect, a combined silicon-on-insulator (SOI) and CMOS process to form an array of imaging devices on a wafer is disclosed, comprising: providing a SOI wafer comprising an insulator layer and a device silicon layer; processing the device silicon layer through a bulk CMOS process flow; and fabricating the array of imaging devices.

The structure in accordance with the present disclosure is extremely planar and provides a 100% optical fill factor, thus providing absence of obscurations. Since light does not have to travel through the thick ILDs to reach the anodic silicon, the structure has a low aspect ratio between the vertical and lateral dimension, resulting in excellent angular response and low optical crosstalk. Absence of obscurations, unwanted reflections, deflections and absorption enable imager development with superior angular response, sensitivity and QE.

A first advantage of the structure of the present disclosure is high quantum efficiency due to the presence of a 100% fill factor notwithstanding the presence of other MOSFETs near the junction diode.

A second advantage of the structure of the present disclosure is an excellent angular response due to the direct coupling of light into silicon without the presence of obscurations and unwanted reflections from multiple metal layers and ILDs that would have been present if optical illumination would have been carried out through the ILDs, as well as due to elimination of the distance between the point where the light enters the device and where it is converted into photoelectrons.

A third advantage of the structure of the present disclosure is an efficient implementation of microlens and anti-reflection coatings due to the availability of a planar surface for optical collection.

Further, the structure of the present disclosure allows integration of appropriate capacitors and other signal conditioning circuits for electronic shuttering, ADC implementation, gain-ranging and so on. Still further, compatibility with next generation metals (e.g. Cu) and low-k dielectrics is provided, since in the structure of the present disclosure, light does not travel through the ILDs to reach the optical conversion layer.

BRIEF DESCRIPTION OF THE DRAWINGS

FIGS. 9A-9E show cross sectional views of a technique for fabricating imaging structures in accordance with the present disclosure.

DETAILED DESCRIPTION

In accordance with the present disclosure, a backside illuminated imaging architecture is provided.

Figure 2:
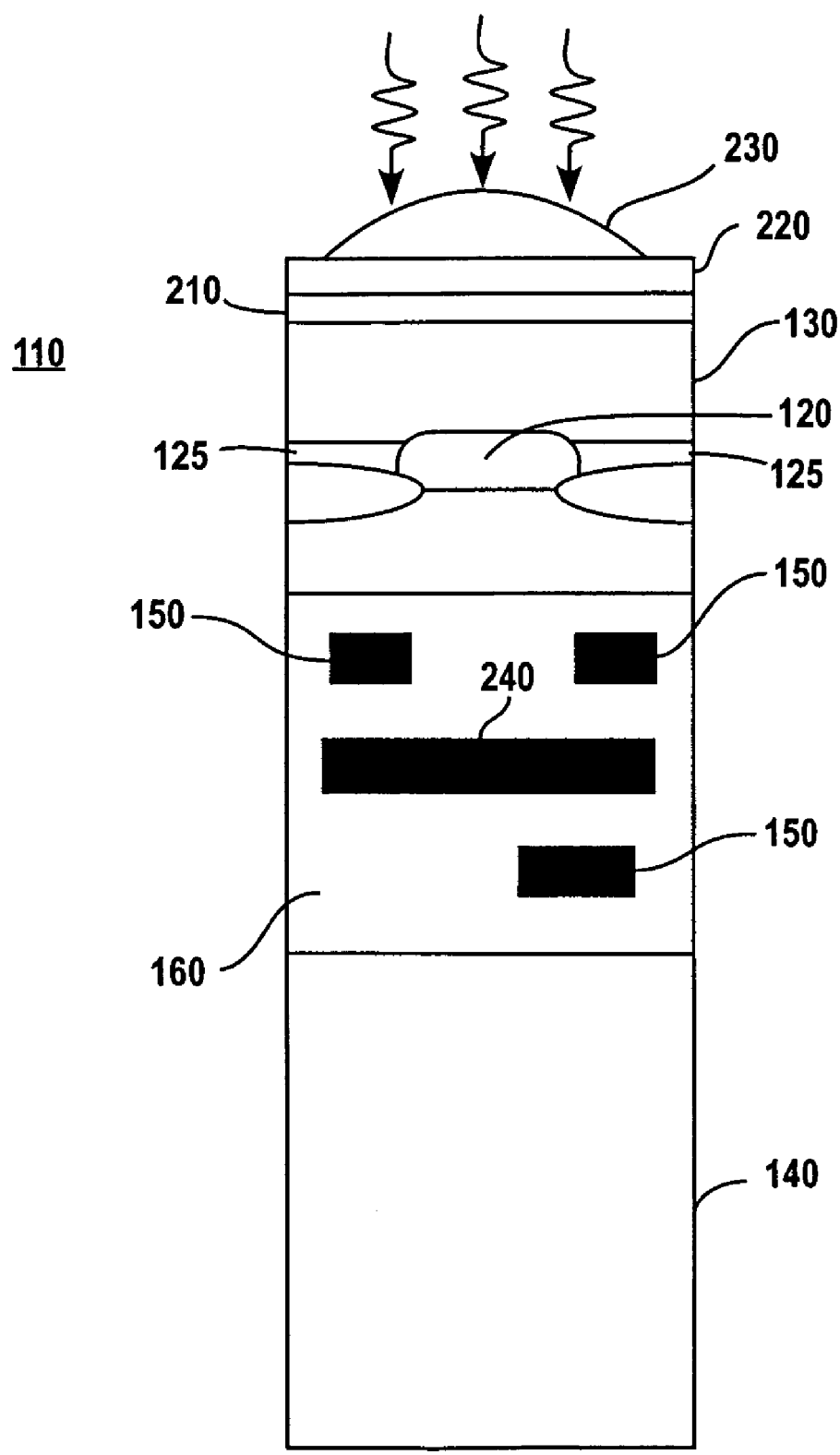
FIG. 2 shows a cross section of the optical collection part of a backside illuminated pixel for the CMOS/CCD imager in accordance with the present disclosure.

FIG. 2 shows a cross section of the optical collection part of a backside illuminated pixel for the CMOS/CCD imager in accordance with the present disclosure.

The photodetector 110 comprises a deep implanted n-well 120 acting as a junction cathode and a low-doped epitaxial silicon layer 130 acting as the anode. The photodetector 110 is mechanically supported by a substrate 140. The substrate 140 can be a glass or organic substrate.

Figure 1:
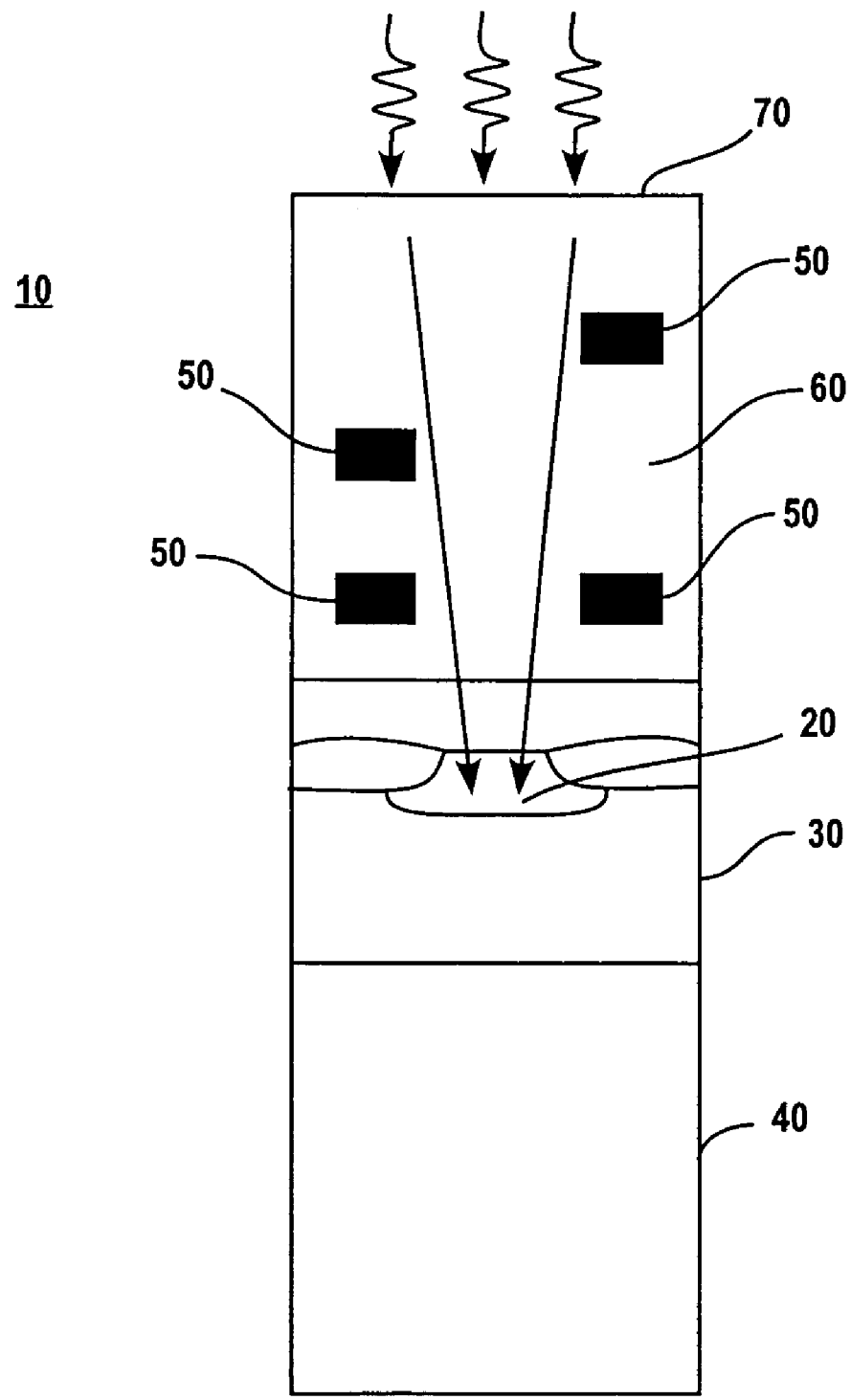
FIG. 1 shows a vertical cross-section of the optical collection part of a prior art front-illuminated pixel.

Similarly to FIG. 1, FIG. 2 also shows metal layers 150 for interconnection of circuits and photo-detectors fabricated on the epitaxial silicon layer 130. The metal layers 150 are separated and protected by inter-layer dielectric (ILD) 160.

FIG. 2 also shows a passivation layer 210 applied on the anodic silicon layer 130. The passivation layer 210 allows dark current to be brought down to acceptable levels and sufficient QE to be obtained. Also shown in FIG. 2 is an anti-reflection coating 220 and a microlens 230. Also a color filter can be provided. The passivation layer 210 also allows preventing damage to the underlying silicon 130 during the deposition of the coating 220, color filters and microlens 230.

The person skilled in the art will notice that in the device according to the present disclosure the light collection point is brought closer to the photodetector.

Next to the junction cathode 120, an additional p-type implant 125 can be added to prevent pixel to pixel crosstalk. Further, a reflector layer 240 can be embedded in the ILD 160 to provide better red response by making the longer wavelength photons make multiple passes through the anodic silicon 130. The metal reflecting layer 240 (made, for example, of Al or Cu) also prevents long wavelength (red) crosstalk between pixels by preventing unwanted reflections.

In this paragraph, the process for fabricating the metal reflecting layer 240 will be briefly discussed. A CMOS process comprises multiple metal stacks. One of the metal layers will be reserved for implementing the total reflecting layer 240. The reflecting layer allows to improve red response and red cross-talk. The absorption depth of light in silicon increases with increasing of the wavelength of light. Absorption depth refers to the depth at which 63% of the incident light is absorbed and converted into photoelectrons.

Figure 3:
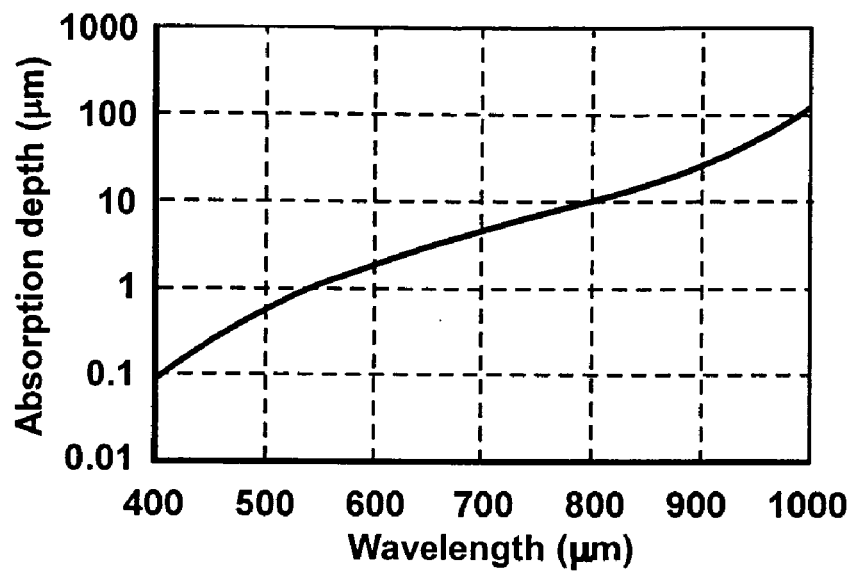
FIG. 3 shows a wavelength as a function of absorption depth.

The wavelength dependence of absorption is well known, and is shown in FIG. 3. It can be seen that the absorption depth is only 0.1 µm at 400 µm (blue light), but reaches >5 µm at 700 µm (red light).

If the device silicon is only 3-4 µm thick, a substantial portion of the red and near infrared light goes through the silicon unabsorbed in the back-illuminated imager structure. These photons are then scattered back at different depth from different interfaces (e.g., ILD-based interface), and are then captured by the silicon. These spurious and scattered reflections vastly diminish image quality by generating a number of image artifacts, such as ghosting, halo from diffuse background, image blurring, and etaloning.

The presence of the layer 240 in accordance with the present disclosure eliminates these unwanted reflections. The metal reflector layer is patterned and aligned with the pixel structures to provide directed reflection, suppressing spurious light coupling. Also, being part of the CMOS process, these reflectors reside close to the silicon surface. The layer 240 serves two purposes. First, it reflects back unabsorbed light from close to the silicon surface so that it may be quickly absorbed in the device silicon increasing the red sensitivity. Secondly, by being close to the device silicon layer and providing a highly reflective surface, it provides directed reflection and suppresses scattered and spurious reflection, improving picture quality. The presence of a layer 240 works best with a microlens on top that focuses the light to a small known spot.

Figure 4:
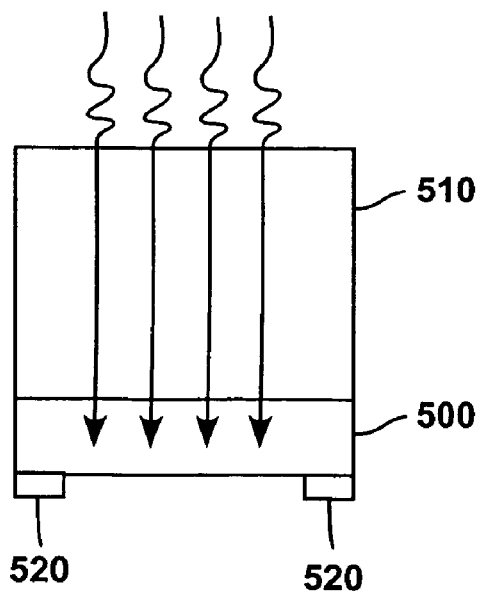
FIG. 4 shows a prior art backside illuminated structure.

Back-illuminated imagers are known as such. As shown in FIG. 4, those imagers are implemented with a silicon device layer 500 (functionally similar to the silicon layer 130 of FIG. 2) mounted on a transparent substrate 510, with metal bonding pads 520 residing on the frontside of the chip. The transparent substrate 510 provides mechanical support and has, therefore, a thickness of several hundreds µm. Light passes through the transparent substrate 510 before getting absorbed in the silicon imager residing underneath it. Since the metal pads 520 reside on the side opposite to that where light enters the imager, a non-standard packaging scheme must be used.

Figure 5:
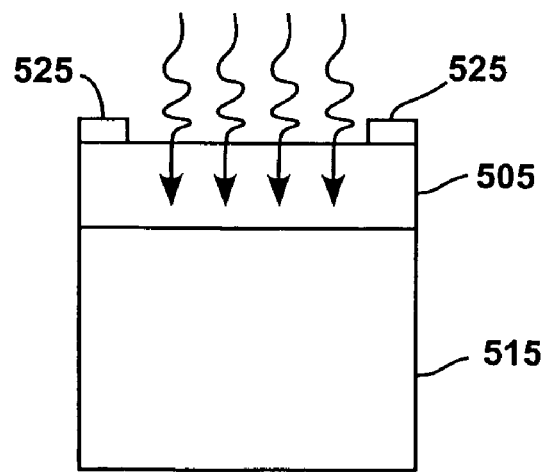
FIG. 5 shows a backside illuminated structure in accordance with an embodiment of the present disclosure.

FIG. 5 shows a different approach, in accordance with an embodiment of the present invention. The metal pads 525 are brought out through the back of the silicon wafer, and mechanical support in form of the bonded base 515 lies underneath the silicon 505.

The structure of FIG. 5 provides several advantages. A first advantage is that the conventional structure of FIG. 4, light has to pass through hundreds of µm of transparent material 510 before getting absorbed in the silicon layer 500. This results in greatly reduced angular response and vastly degraded optical cross-talk. In the structure of FIG. 5, there is no spacer 510 between the entrance point of light and its collection point. Elimination of the spacer 510 is important to improved angular response and prevention of optical crosstalk.

A second advantage is that the thickness of the spacer material 510 in the conventional structure makes it impossible to apply and align color filters, anti-reflection coatings, and/or microlens. By eliminating the spacer 510, the structure of FIG. 4 enables very efficient color filter, anti-reflection coating and microlens integration, both in terms of optical performance and ease of alignment.

A further advantage is that, in the structure of FIG. 5, the metal pads 525 reside on the same side of light entrance. Thus, the structure of FIG. 5 is fully compatible with standard packaging schemes and processes, enabling a low-cost and reliable solution.

In the following, methods for fabricating the imager of FIGS. 2 and 5 will be discussed.

The main challenges in generating the structures shown in FIGS. 2 and 5 are the following:

1. Accurate formation of the epitaxial silicon layer of appropriate thickness, for example of the order of 5-15 μm, with surface non-planarity <λ/10, where λ is the shortest wavelength to be detected. Wafer level backside thinning requires thinning a 500-700 μm wafer down to 5-15 μm of end thickness uniformly (with residual local non-uniformity less than 50 nm) over an entire 200-300 mm wafer. Lack of uniformity results from the absence of appropriate etch stop. Most etch stops rely on the difference in silicon doping to terminate the etching. This is an extremely difficult proposition since, after the thermal process that is inherent in semiconductor micro-fabrication, the boundary between a heavily doped region and a lightly doped region is severely smeared out.
2. Formation of structures for minimization of carrier collection by diffusion.
3. Passivation of the silicon surface exposed to light, i.e. reduction of the dangling bonds and interface trap density to a level commensurate with imaging. Following thinning, the exposed silicon surface has a high density of interface traps that result in orders of magnitude increase in dark current and loss of blue quantum efficiency (since the absorption depth of shorter wavelength light is very small). In order to passivate these traps, non-conventional techniques need to be used, since high temperature steps cannot be used for annealing implants due to the presence of metals with low melting point in the front side of the wafer. The use of non-conventional passivation techniques also precludes their use at a wafer scale.
4. Wafer-level processing instead of die-level processing.

Figure 6:
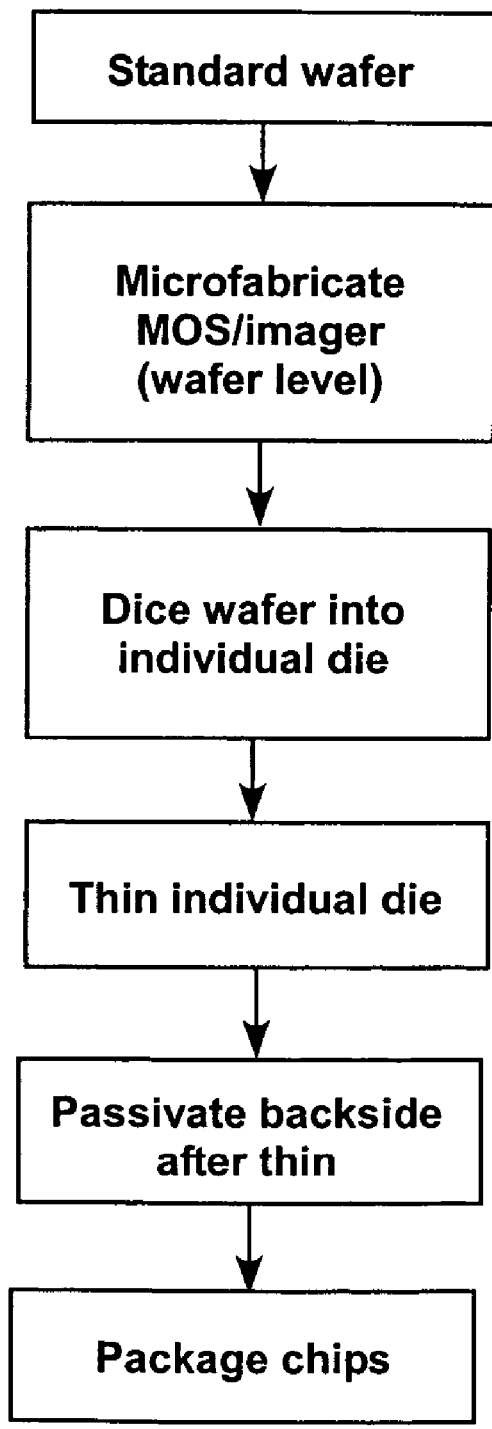
FIG. 6 shows a flowchart of a prior art technique for fabricating imaging structures.

FIG. 6 shows a series of steps in accordance with a prior art thinning process. As indicated in the figure, thinning occurs after dicing the wafer into individual dies.

Figure 7:
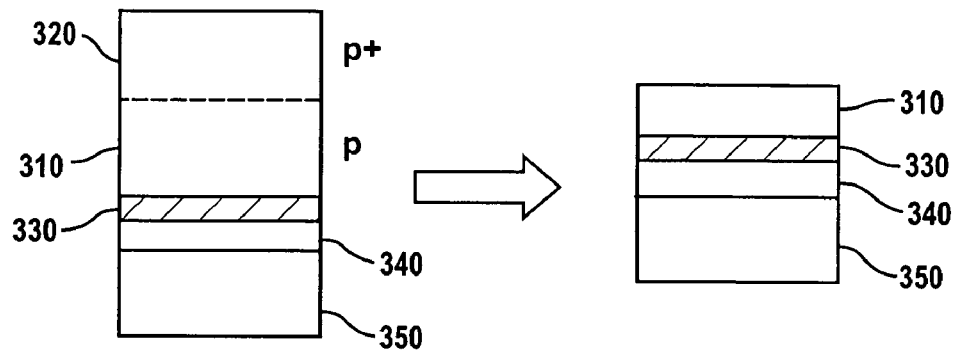
FIG. 7 shows cross sectional views of a prior art technique for fabricating imaging structures.

FIG. 7 shows a die-level technique for fabricating an imaging structure in accordance with the process of FIG. 6. An epitaxial silicon layer 310 is grown on a heavily doped substrate 320 using a conventional MOS micro-fabrication process flow, and the heavily doped p+ substrate 320 is later etched away after all MOS processing including metallization has been carried out. FIG. 6 also schematically shows a device layer 330, an ILD layer 340 and a backing material 350.

The above mentioned approach suffers from two limitations. First, lack of appropriate etch stops results in uncontrolled p-layer thickness. Etching of silicon is done either as a timed-etch or through the use of a dopant-selective etch stop. Since the ratio of the starting thickness of the p+ substrate to the final p-layer thickness is very high (about 50-100), it is very difficult to reliably produce the final structure (right side of FIG. 7) with uniform and accurately controlled p-layer thickness. The latter approach suffers from the availability of appropriate dopant-selective silicon etches.

Secondly, the approach of FIG. 7 can result in an unwanted imaging structure. Due to high temperature processing inherent in silicon micro-fabrication, the interface between the p+ substrate 320 and the p-epitaxial layer 310 is not sharply defined as the schematic cross section of the left portion of FIG. 7 may appear to imply. The smearing of dopants at the 310-320 interface results in unwanted doping of the p-layer 320, causing a loss of imaging performance. In addition, this smearing also impairs the ability to generate a p-layer accurately controlled thickness since a dopant-selective etch-stop would have required an abrupt doping transition from the p+ substrate 320 and the p-epitaxial layer 310.

Further, after thinning, the interface trap density at the unterminated silicon surface is unacceptably high, while a naturally formed native oxide (about 20 Å thickness) causes the surface to become positively charged. Unwanted band-bending and the presence of dangling bonds result in a loss of QE and unacceptably high dark currents, rendering the structure shown in FIG. 6 incapable of being used for imaging.

Surface passivation of the structure shown in FIG. 7 presents its own set of unique problems. Since the thinning and passivation can be being carried out as a post-metallization process step, high temperature (>400° C.) processing steps should not be allowed, since the front side can already be covered with low melting point metals (e.g. Al). Therefore, in such cases, surface passivation through implantation cannot be used, since implant activation requires high temperature anneal.

To overcome this problem, refractory metals and multiple polysilicon layers can be used for interconnection. However, such techniques are not compatible with a CMOS process flow that uses metals with low melting points. Other passivation techniques include UV-flooding, flash gates (MBE deposited monolayer of metal), boron doping followed by high energy pulsed laser anneal, low pressure oxide deposition, and delta doping through molecular beam epitaxy (MBE).

The above mentioned processes are complex and require non-conventional tools, making them incompatible with high volume silicon microfabrication, and causing severe loss of reliability and yield. Thus, it is typical for CCD thinning to be carried out at die level and not at the wafer level, and is one of the main reasons why backside illuminated imagers could suffer from poor reproducibility, yield, and reliability issues.

The following paragraphs will present a method which overcomes the above problems and is equally applicable for CCD or CMOS imager implementation.

Figure 8:
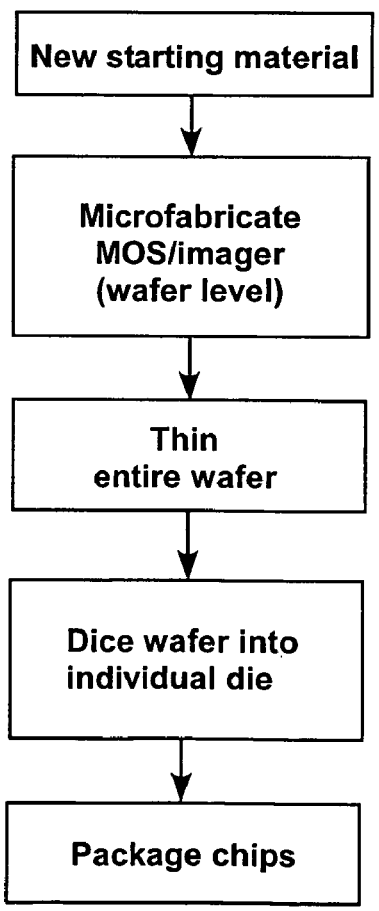
FIG. 8 shows a flowchart of a technique for fabricating imaging structures in accordance with the present disclosure.

FIG. 8 shows a series of steps of a thinning process in accordance with an embodiment of the present disclosure. As shown in the third step of FIG. 8, thinning occurs at wafer-level, and not at die-level as in the prior art. In the approach according to FIG. 8, the above mentioned problems are solved in the following ways.

Use of a new starting material with a pre-passivated silicon surface. Pre-passivation is carried out by growing $SiO_2$ on the silicon surface.

Use of an accurate etch-stop. The structure comprises a buried oxide layer that acts as an accurate etch-stop for silicon. For instance, the etching rate of silicon with TMAH (tetramethylammonium hydroxide) at 90° C. is four orders of magnitude higher than that of $SiO_2$.

Protection of the backside silicon surface. In the process according to the present disclosure, backside etching stops at the buried $SiO_2$ that sits on top of the device silicon (where the imager resides). Since the device silicon is never exposed during the thinning process, the silicon surface is protected from the deleterious effects of etching. Thus, unlike conventional backside thinning approaches, no interface traps are created on the silicon backside as a result of backside etching. Thus, in the approach according to the present disclosure, there is no need for post-thinning passivation of the backside, solving one of the major problems of backside illuminated imager implementation.

FIGS. 9A-9E show a wafer-level technique for fabricating an imaging structure in accordance with the process of FIG. 8.

In accordance with the embodiment of FIGS. 9A-9E, instead of using a conventional bulk CMOS wafer comprising a p-epitaxial layer grown on a heavily-doped p-type substrate, a special silicon-on-insulator (SOI) wafer is used.

FIG. 9A shows the starting wafer which comprises a thermal oxide layer 410 buried between a low-doped thick silicon wafer (could be p or n type) 420 and device silicon (e.g., 5 μm thick with $2\times10^{14}/cm^3$ boron doping) 430. The thick silicon wafer 420 can be used as handle wafer for mechanical support.

Although starting with a SOI wafer, a conventional bulk CMOS process flow is used to generate CMOS imagers through implantation, oxidation, ILD, metal deposition and patterning at wafer level. Any bulk CMOS process can be used, for example a bulk CMOS process optimized for imaging. After CMOS fabrication, the structure shown in FIG. 9B is obtained, where a device layer 440 and ILD 450 are also shown.

In order to prepare for backside illumination, the structure is bonded to a glass wafer 460 for mechanical support, as shown in FIG. 9C.

In the step shown in FIG. 9D, the silicon handle wafer 420 is removed, through mechanical grinding, wet etching and/or RIE etching (reactive ion etching), for example. The buried $SiO_2$ layer 410 provides a natural etch stop, generating a uniformly planar back surface.

In addition, the resultant structure is self-passivated, since it comprises a thermally grown Si—$SiO_2$ interface that will be exposed to light during imaging. Termination of silicon by the oxide layer renders additional passivation unnecessary, eliminating the need for additional passivation that could not only difficult to achieve but also incompatible with standard VLSI processing. Since the passivation is automatic, resulting from the use of starting material 410, the process flow described in FIGS. 9A-9E is fully CMOS compatible and can be carried out at the wafer level.

Furthermore, since the device silicon is separated from the handle wafer through the buried oxide, no unintentional doping of the device silicon occurs during CMOS processing. Thus, it becomes possible to choose appropriate doping of the device silicon layer during the time of starting material selection without it being altered by processing steps. This is particularly critical, since high charge collection efficiency (minimization of the field-free region) requires lower device silicon doping that is difficult to achieve in bulk CMOS wafer that has undergone a bulk CMOS process.

FIG. 9E shows a final step in the process, i.e. deposition of anti-reflection coating 470 for improved optical coupling through a suppression of reflection at the Si—$SiO_2$ interfaces. Since the resultant structure is fully planar and has only a single $SiO_2$ layer (as opposed to multilayer dielectrics), it allows complete freedom to create and optimize an antireflection layer that would have been possible if the light traveled through the multilayer and non-uniform ILD in the front-illumination case.

Figure 10:
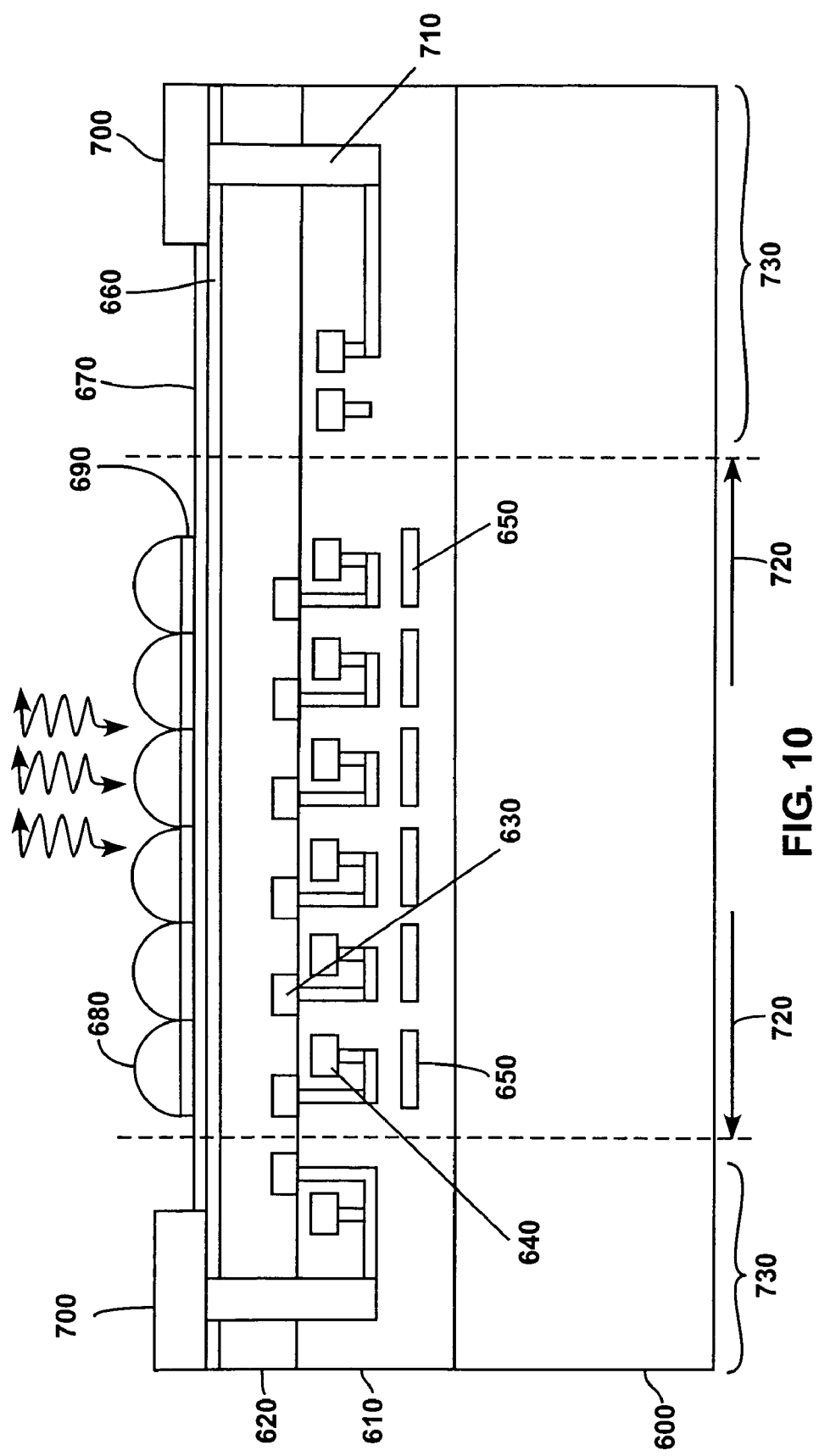
FIG. 10 shows a schematic view of a combination of FIGS. 2 and 9E seen at the wafer level.

FIG. 10 shows a schematic view of a combination of FIGS. 2 and 9E seen at the wafer level. A bonded base 600 (see also element 140 in FIG. 2, element 515 in FIG. 5 and element 460 in FIGS. 9C-9E) is connected to inter-layer dielectric (ILD) 610 (see also element 160 in FIG. 2 and element 450 in FIGS. 9B-9E). ILD 610 is connected to a silicon layer 620 (see also element 130 in FIG. 2, element 505 in FIG. 5 and element 430 in FIGS. 9A-9E). Photodiodes 630 and MOS gates 640 are disposed between ILD 610 and the silicon layer 620. Also shown is a plurality of metal reflectors 650 (see also element 240 in FIG. 2). A passivation layer 660 (see element 210 of FIG. 2) is disposed on top of silicon layer 620, and anti-reflection coating 670 (see element 220 of FIG. 2) is disposed above the passivation layer 660. A plurality of microlenses 680, together with a color filter 690 is also shown. Metal pads 700 (see elements 525 of FIG. 5) are disposed at the sides of the wafer. Those pads are connected with ILD 610 by means of interconnect metal 710. Arrows 720 represent the extension of an individual die forming an imaging array to be obtained by dicing in accordance with the fourth step of FIG. 8. Elements located in regions 730 at the sides of the wafer, including metal pads 700 and interconnect metal 710, form non-imaging support electronics. Therefore, a wafer obtained in accordance with the present disclosure will contain two side regions 730 and a plurality of imaging array regions to be diced into individual dies and packaged.

Figure 11:
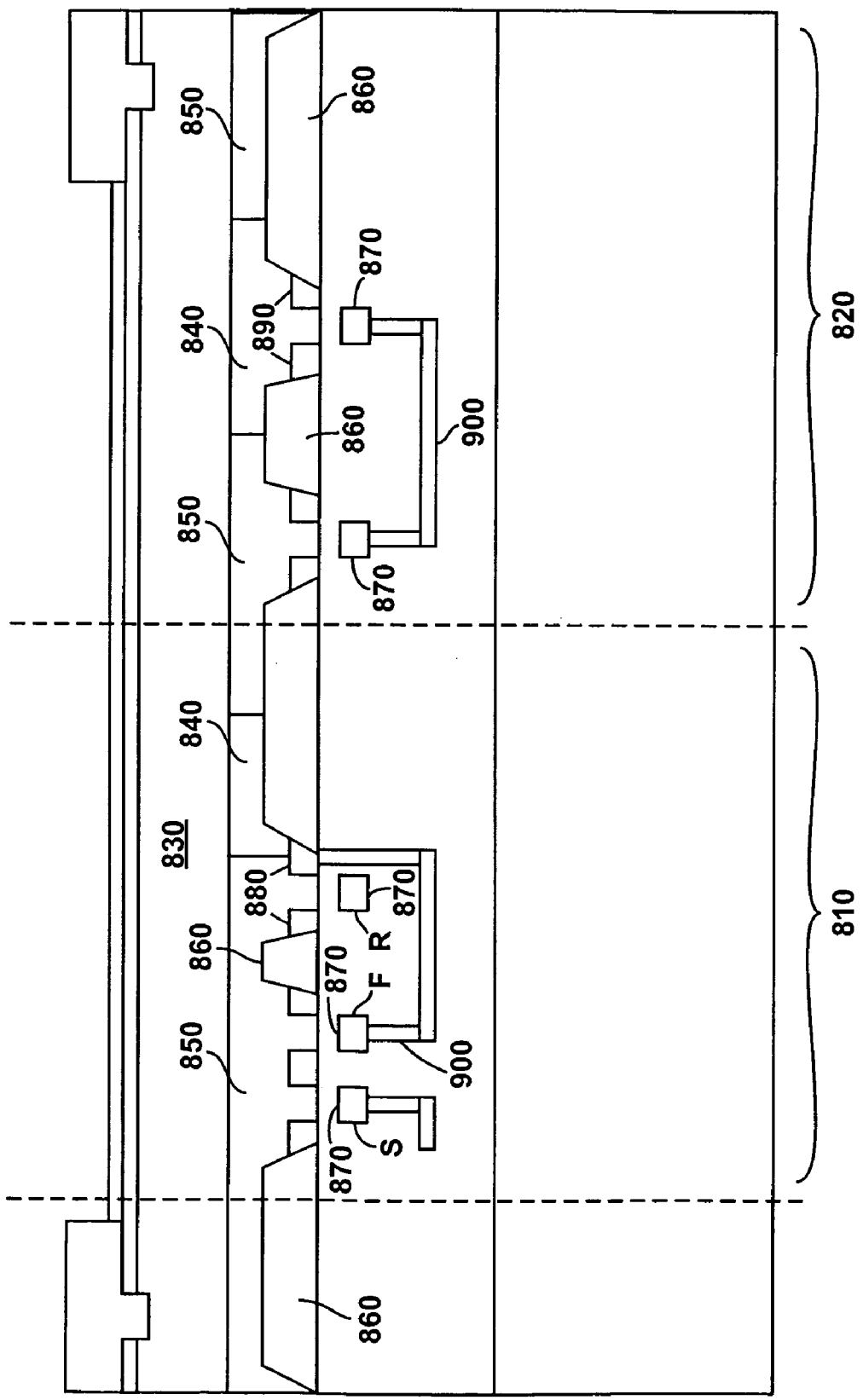
FIG. 11 shows a cross sectional view of a combined SOI bulk-CMOS process at the wafer level to fabricate an array of imaging devices.
Figure 12:
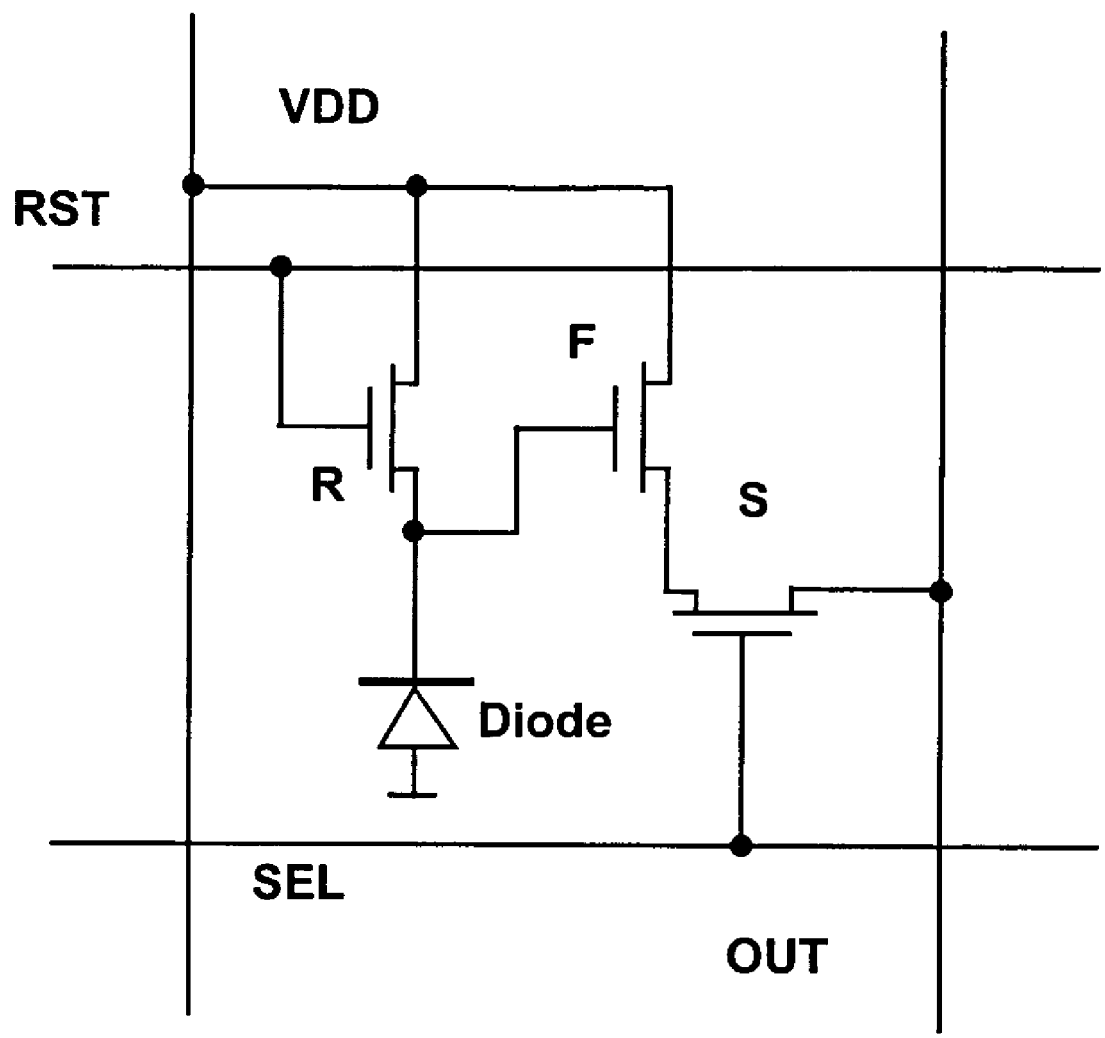
FIG. 12 shows a circuital diagram of the structure of FIG. 11.

FIGS. 11 and 12 show a further embodiment in accordance with the present disclosure. In FIG. 11, the imaging chip is divided into two sections: a first area 810 containing an imaging array, and a second area 820 containing CMOS peripheral/signal processing circuits. The imaging array and CMOS circuits are built on the device silicon 830 (see also element 430 in FIGS. 8A-8E) residing on the standard SOI wafer (see also FIG. 9A) using a standard bulk CMOS imager compatible fabrication process.

Unlike a traditional SOI silicon thickness of <0.5 μm, the preferred device silicon thickness of the structures in accordance with the present disclosure is of about 3 μm to about 10 μm, in order to provide sufficient optical response.

Given the silicon thickness, a bulk-CMOS process is preferably used for fabrication of the devices in accordance with the present disclosure, although the wafer is of SOI-type. The use of a bulk-CMOS process is advantageous, since all state-of-the-art CMOS imager processes are of the bulk-CMOS type. Thus, the structure in accordance with the present disclosure enables high quality CMOS imager implementation by mixing two diverse elements: the application of a bulk-CMOS process on a new SOI-type starting material.

The doping concentrations of the different silicon layers are shown in the following table:

| Layer | Thickness | type | concentration |
|---|---|---|---|
| Device silicon | 3-10 μm | P | $1 \times 10^{14}$-$1 \times 10^{15}/cm^3$ |
| P-well | 0.5-1 μm | P | $5 \times 10^{16}$-$5 \times 10^{17}/cm^3$ |
| N-well | 1-2 μm | N | $5 \times 10^{16}$-$5 \times 10^{17}/cm^3$ |

The doping concentrations shown in the table ore only approximate, and will be changed based on specific fabrication recipes used. The doping concentration of the device silicon 830 is chosen based on the thickness of the device silicon, which is again based on the degree of the required red response. As the device silicon thickness is increased, the doping concentration will be reduced in order to increase the depletion region thickness, and minimize the amount of undepleted silicon. Minimization of undepleted silicon is important for both an improvement in quantum efficiency (and hence sensitivity) and cross-talk performance. Thus, the starting material can be optimized for the required red response by changing the thickness of the silicon and its doping concentration.

Turning to FIG. 11, following a bulk-CMOS process flow, the imager array and the support electronics circuits are fabricated as follows. All MOS devices reside in the n-well 840 and p-well 850 that are implanted from the front side. Devices are isolated from each other by using isolation oxides (thermal and/or deposited) in form of LOCOS or STI (shallow trench isolation) structures. FIG. 11 shows an STI isolation structure with STI elements 860. In the process, the photodiode is also formed, between the n-well and the p-type device silicon layer.

Following the above steps, the gate oxide is grown, followed by MOSFET polysilicon gate 870 deposition and patterning. The source-drain (S/D) implants 880 (N+), 890 (P+) are carried out in a self-aligned fashion (aligned to the respective polysilicon gates 870) to complete the MOSFET formation. The FETs in the pixels are labeled S (Select FET), R (Reset FET), and S (Source follower FET). The pixel circuit is shown in FIG. 12.

As shown in FIGS. 11 and 12, the cathode of the photodiode or the n-well 840 is connected to the source 880 of the R FET. The S/D implants (e.g., 880, 890) and gates 870 are connected by metal lines 900 that are separated from each other and the silicon by deposited ILD stacks that are typically comprised of oxides and nitrides.

While several illustrative embodiments of the invention have been shown and described in the above description, numerous variations and alternative embodiments will occur to those skilled in the art. Such variations and alternative embodiments are contemplated, and can be made without departing from the scope of the invention as defined in the appended claims.

What is claimed is:

1. A combined silicon-on-insulator (SOI) and CMOS process to form an array of photodetectors on a wafer, comprising:
   providing a SOI wafer comprising an insulator layer buried between a silicon wafer and a device silicon layer;
   forming a device layer and interlayer dielectric to form a plurality a photodiodes by processing the device silicon layer through a bulk CMOS process flow;
   removing the silicon wafer to expose the insulator layer;
   processing the exposed insulator layer to form a passivation layer on the device silicon layer, the passivation layer configured to decrease dark current while keeping quantum efficiency of the photodetectors; and
   providing microlenses above the passivation layer, each microlens placed in correspondence of a photodiode.

2. The process of claim 1, wherein the device silicon layer has a thickness from about 3 µm to about 10 µm.

3. The process of claim 1, wherein a doping concentration of the device silicon layer is inversely proportional to a thickness of a depletion region of the device silicon layer.

4. The process of claim 1, further comprising:
   forming an anti-reflection coating between the passivation layer and the microlenses.

5. The process of claim 1, further comprising:
   forming color filters between the passivation layer and the microlenses.

6. The process of claim 4, further comprising:
   forming color filters between the anti-reflection coating and the microlenses.

7. The process of claim 1, wherein each photodiode of the plurality of photodiodes is connected to a corresponding MOS gate located underneath the photodiode.

8. A combined silicon-on-insulator (SOI) and CMOS process to form an array of photodetectors on a wafer, comprising:
   providing a SOI wafer comprising an insulator layer buried between a silicon wafer and a device silicon layer;
   forming a device layer and interlayer dielectric to form a plurality a photodiodes by processing the device silicon layer through a bulk CMOS process flow;
   removing the silicon wafer to expose the insulator layer;
   processing the exposed insulator layer to form a passivation layer on the device silicon layer, the passivation layer configured to decrease dark current while keeping quantum efficiency of the photodetectors; and
   providing color filters above the passivation layer, each color filter placed in correspondence of a photodiode.

9. The process of claim 8, further comprising:
   forming an anti-reflection coating between the passivation layer and the color filters.

10. The process of claim 8, further comprising:
    forming microlenses above the color filters.

11. The process of claim 8, wherein each photodiode of the plurality of photodiodes is connected to a corresponding MOS gate located underneath the photodiode.

12. A combined silicon-on-insulator (SOI) and CMOS process to form an array of photodetectors on a wafer, comprising:
    providing a SOI wafer comprising an insulator layer buried between a silicon wafer and a device silicon layer;
    forming a device layer and interlayer dielectric to form a plurality a photodiodes by processing the device silicon layer through a bulk CMOS process flow;
    removing the silicon wafer to expose the insulator layer;
    processing the exposed insulator layer to form a passivation layer on the device silicon layer, the passivation layer configured to decrease dark current while keeping quantum efficiency of the photodetectors; and
    providing optical imaging elements above the passivation layer, each optical imaging element placed in correspondence of a photodiode.

* * * * *